(12) United States Patent
Tamai

(10) Patent No.: US 7,399,154 B2
(45) Date of Patent: Jul. 15, 2008

(54) VACUUM PROCESSING SYSTEM BEING ABLE TO CARRY PROCESS OBJECT INTO AND OUT OF VACUUM CHAMBER

(76) Inventor: Tadamoto Tamai, 793-0072 Otsu 1367, Himi Saijo City, Ehime Prefecture (JP)

( * ) Notice: Subject to any disclaimer, the term of this patent is extended or adjusted under 35 U.S.C. 154(b) by 361 days.

(21) Appl. No.: 10/806,149

(22) Filed: Mar. 23, 2004

(65) Prior Publication Data

US 2004/0191028 A1    Sep. 30, 2004

(30) Foreign Application Priority Data

Mar. 25, 2003    (JP)    ............................. 2003-081815

(51) Int. Cl.
B65G 49/07    (2006.01)
(52) U.S. Cl. ...................... 414/217; 414/939
(58) Field of Classification Search ................. 414/217, 414/939
See application file for complete search history.

(56) References Cited

U.S. PATENT DOCUMENTS

| | | | |
|---|---|---|---|
| 4,311,427 A | 1/1982 | Coad et al. | |
| 4,836,733 A | 6/1989 | Hertel et al. | |
| 5,019,233 A * | 5/1991 | Blake et al. ............ | 204/192.12 |
| 5,349,762 A * | 9/1994 | Kato et al. .................... | 34/406 |
| 5,690,744 A | 11/1997 | Landau | |
| 5,742,393 A | 4/1998 | Landau et al. | |
| 5,857,826 A * | 1/1999 | Sato et al. ................ | 414/744.6 |
| 6,045,315 A * | 4/2000 | Azumano et al. ........... | 414/217 |
| 6,120,601 A | 9/2000 | Landau et al. | |
| 6,315,512 B1 * | 11/2001 | Tabrizi et al. ............... | 414/217 |
| 6,350,097 B1 * | 2/2002 | Mitchell et al. ............. | 414/217 |
| 6,450,750 B1 * | 9/2002 | Heyder et al. ............... | 414/217 |
| 6,690,986 B1 * | 2/2004 | Mitchell et al. ............. | 700/112 |
| 6,852,644 B2 * | 2/2005 | Dickinson .................... | 438/758 |
| 6,970,770 B2 * | 11/2005 | Iijima et al. ................. | 700/218 |

(Continued)

FOREIGN PATENT DOCUMENTS

JP    09-063939 A    3/1997

(Continued)

OTHER PUBLICATIONS

Japanese Office Action dated Oct. 16, 2007 (mailing date), issued in corresponding Japanese Patent Application No. 2004-242382.

(Continued)

*Primary Examiner*—James Keenan
(74) *Attorney, Agent, or Firm*—Westman, Hattori, Daniels & Adrian, LLP.

(57) ABSTRACT

First and second load-lock mechanisms are installed in a vacuum chamber. An external arm and first and second robot arms are disposed outside of the vacuum chamber. The external arm can hold a process object and can carry the held process object either into the first load-lock mechanism or into the second load-lock mechanism. The first robot arm can transfer the process object between a stock site outside of the vacuum chamber and the first load-lock mechanism and between the stock site and the external arm. The second robot arm can transfer the process object between the stock site and the second load-lock mechanism and between the stock site and the external arm.

7 Claims, 3 Drawing Sheets

U.S. PATENT DOCUMENTS

| | | | |
|---|---|---|---|
| 2002/0006323 A1* | 1/2002 | Yoshida et al. | 414/217 |
| 2003/0113188 A1* | 6/2003 | Pool | 414/217 |
| 2003/0123958 A1* | 7/2003 | Sieradzki et al. | 414/217 |
| 2004/0013497 A1 | 1/2004 | Shirai | |
| 2004/0234359 A1* | 11/2004 | Mitchell et al. | 414/217 |

FOREIGN PATENT DOCUMENTS

| | | |
|---|---|---|
| JP | 10-125764 | 5/1998 |
| JP | 2000174091 A | 6/2000 |

OTHER PUBLICATIONS

Japanese Office Action dated Apr. 15, 2008 (mailing date), issued in corresponding Japanese Patent Application No. 2004-242382.

* cited by examiner

VACUUM PROCESSING SYSTEM BEING ABLE TO CARRY PROCESS OBJECT INTO AND OUT OF VACUUM CHAMBER

CROSS REFERENCE TO RELATED APPLICATION

This application is based on and claims priority of Japanese Patent Application No. 2003-81815 filed on Mar. 25, 2003, the entire contents of which are incorporated herein by reference.

BACKGROUND OF THE INVENTION

A) Field of the Invention

The present invention relates to a vacuum processing system, and more particularly to a vacuum processing system having at least two load-lock mechanisms for carrying a process object into and out of a vacuum chamber.

B) Description of the Related Art

A conventional wafer carrying method will be described by taking as an example an ion implanter. JPA HEI 3-29258 (JPB HEI 7-54688) discloses an ion implanter having a vacuum chamber installed with two load-lock chambers. A wafer is carried in and out via the load-lock chambers.

For carrying wafers, first a robot arm picks up a processed wafer from the load-lock chamber and carries it to a wafer stock area. Thereafter, a new wafer still not processed is picked up from a wafer stock area and once placed on an aligner to adjust the posture of the wafer (position alignment based upon a notch or an orientation flat). Thereafter, the robot arm carries the wafer from the aligner into the load-lock chamber.

Since two load-lock chambers are used, a wafer carrying process can be speeded up.

In a conventional ion implanter, the time taken to carry a wafer into and out of a load-lock chamber and taken to the wafer to another location is longer than the time taken actually to implant ions into the wafer.

SUMMARY OF THE INVENTION

An object of this invention is to shorten the time taken to carry a process object into and out of a load-lock chamber and taken to carry a process object to another location and to improve a process performance of a vacuum processing system.

According to one aspect of the present invention, there is provided a vacuum processing system comprising: a vacuum chamber for defining an inner space capable of being evacuated; a first load-lock mechanism capable of carrying a process object into and out of the vacuum chamber in a state that the vacuum chamber is maintained vacuum; a second load-lock mechanism capable of carrying a process object into and out of the vacuum chamber in the state that the vacuum chamber is maintained vacuum; an external arm disposed outside of the vacuum chamber and being capable of holding the process object and carrying the held process object either into the first load-lock mechanism or into the second load-lock mechanism; a first robot arm disposed outside of the vacuum chamber and being capable of transferring the process object between a stock site outside of the vacuum chamber and the first load-lock mechanism and between the stock site and the external arm; and a second robot arm disposed outside of the vacuum chamber and being capable of transferring the process object between the stock site and the second load-lock mechanism and between the stock site and the external arm.

The process object can be passed from the first robot arm to the external arm, and then carried from the external arm to the first or second load-lock mechanism. During the period while the external arm carries the process object, the first robot arm can carry a processed object out of the first load-lock mechanism.

It is therefore possible to improve the carrying performance of carrying a process object into the vacuum chamber and the vacuum processing efficiency.

DESCRIPTION OF THE PREFERRED EMBODIMENTS

Figure 1:
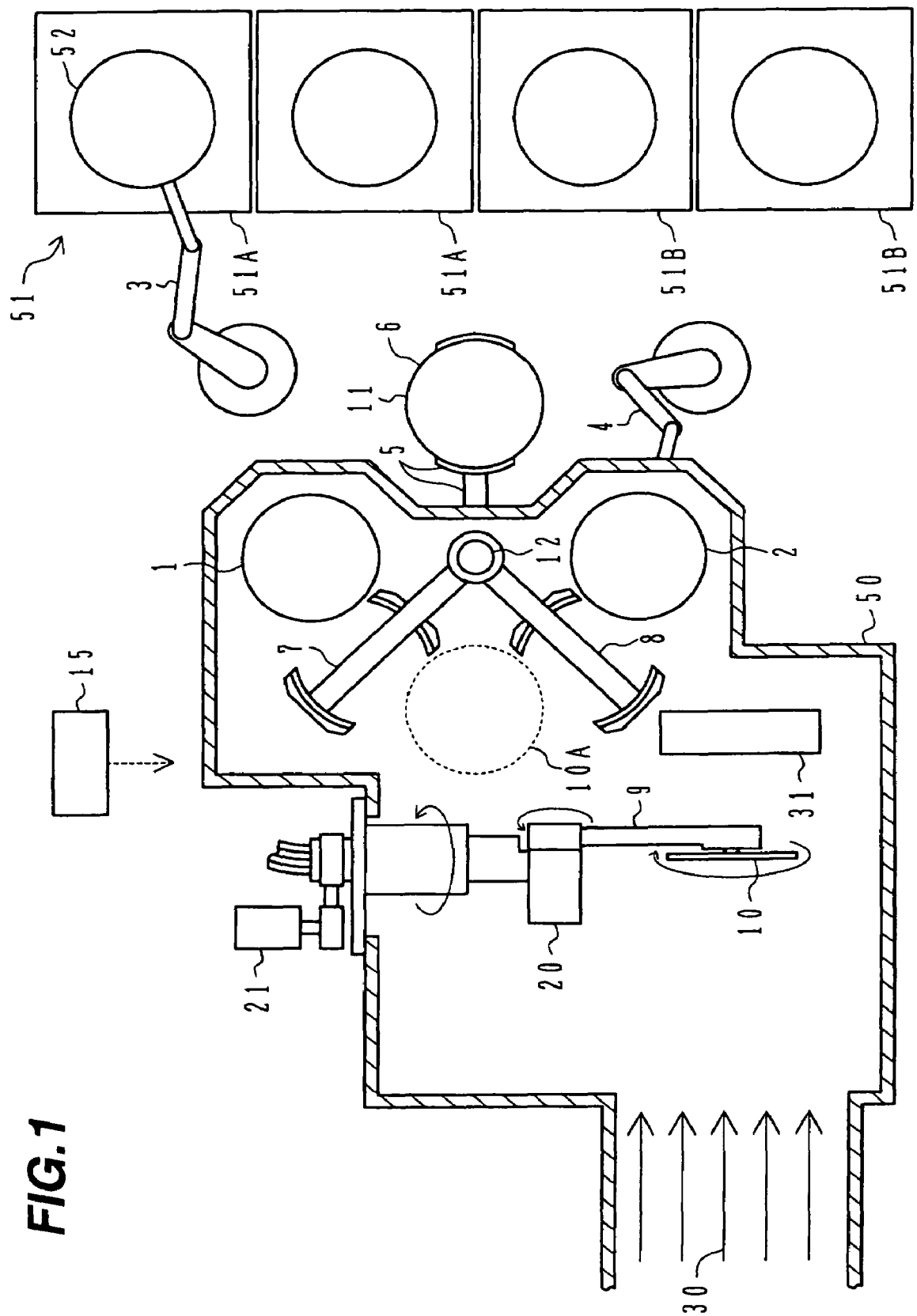
FIG. 1 is a plan cross sectional view of an ion implanter according to an embodiment.

FIG. 1 is a plan view of a vacuum chamber of an ion implanter according to an embodiment of the invention. A first load-lock mechanism 1 and a second load-lock mechanism 2 are installed on the bottom of a vacuum chamber 50 whose inner space can be evacuated. The detailed structures of the first and second load-lock mechanisms 1 and 2 will be later described with reference to FIG. 2. A wafer is carried into and out of the vacuum chamber 50 via the first load-lock mechanism 1 and second load-lock mechanism 2.

A scan arm 9 is disposed in the vacuum chamber 50. A platen 10 mounted on the distal end of the scan arm 9 holds a wafer and places it on a propagation path of an ion beam 30. The propagation path of the ion beam 30 is generally horizontal, and the wafer is held vertically or obliquely relative to the propagation direction of the ion beam 30. A scan motor 20 supports the scan arm 9 to swing it in the range of some angle. The wafer held by the platen 10 can therefore reciprocally move traversing the propagation path of the ion beam 30. A Faraday cup 31 for measuring ion current is disposed downstream relative to the ion beam 30.

A support shaft supporting the scan motor 20 extends outward through the wall of the vacuum chamber 50. This support shaft is rotated by a tilt motor 21. By running the tilt motor 21, the platen 10 can be tilted and located at a load position 10A. The wafer is held generally horizontally in the state that the platen 10 is located at the load position 10A.

Inner arms 7 and 8 are disposed in the vacuum chamber 50. The inner arms 7 and 8 swing about a swing shaft 12 disposed at an equi-distance from the first and second load-lock mechanisms 1 and 2. The distance between the load position 10A and rotary shaft 12 is equal to the distance between the first load-lock mechanism 1 and rotary shaft 12.

The inner arms 7 and 8 can hold and carry a wafer from any position of the first load-lock mechanism 1, second load-lock mechanism 2 and platen 10 located at the load position 10A, to another position. The two internal arms 7 and 8 are disposed at different height positions, so that arms can be swung crossing each other. Accordingly, for example, a wafer held by the first load-lock mechanism 1 can be exchanged with a wafer held by the platen 10 at the load position 10A. Similarly, a wafer held by the second load-lock mechanism 2 can be exchanged with a wafer held by the platen 10 at the load position 10A.

Disposed outside of the vacuum chamber 50 are a first robot arm 3, a second robot arm 4, an external arm 5, an aligner 6, a buffer 11 and hoops 51. The aligner 6 holds a wafer and adjusts the posture of the wafer, basing upon an orientation flat or a notch (position alignment). The buffer 11 temporarily holds a wafer. The aligner 6 and buffer 11 are disposed at vertically overlaid positions. The hoops 51 have a plurality of wafers 52 in stock. Wafers stocked in one hoop 51 are initially still not processed, a wafer is processed one after another and replaced by a wafer still not processed. All wafers are eventually replaced by already processed wafers.

The first robot arm 3 can carry a wafer from any position of the two hoops 51A among the four hoops 51 disposed near the first robot arm 3, first load-lock mechanism 1, aligner 6 and buffer 11, to another arbitrary position. The external arm 5 can receive a wafer held by the aligner 6 and can carry it either to the first load-lock mechanism 1 or to the second load-lock mechanism 2. The second robot arm 4 can carry a wafer from any position of the two hoops 51B among the four hoops 51 disposed near the second robot arm 4, second load-lock mechanism 2, aligner 6 and buffer 11, to another arbitrary position. The first robot arm 3 and second robot arm 4 can pass and receive a wafer via the buffer 11.

The first robot arm 3, second robot arm 4, external arm 5, internal arms 7 and 8 and the like are controlled by a controller 15.

Figure 2:
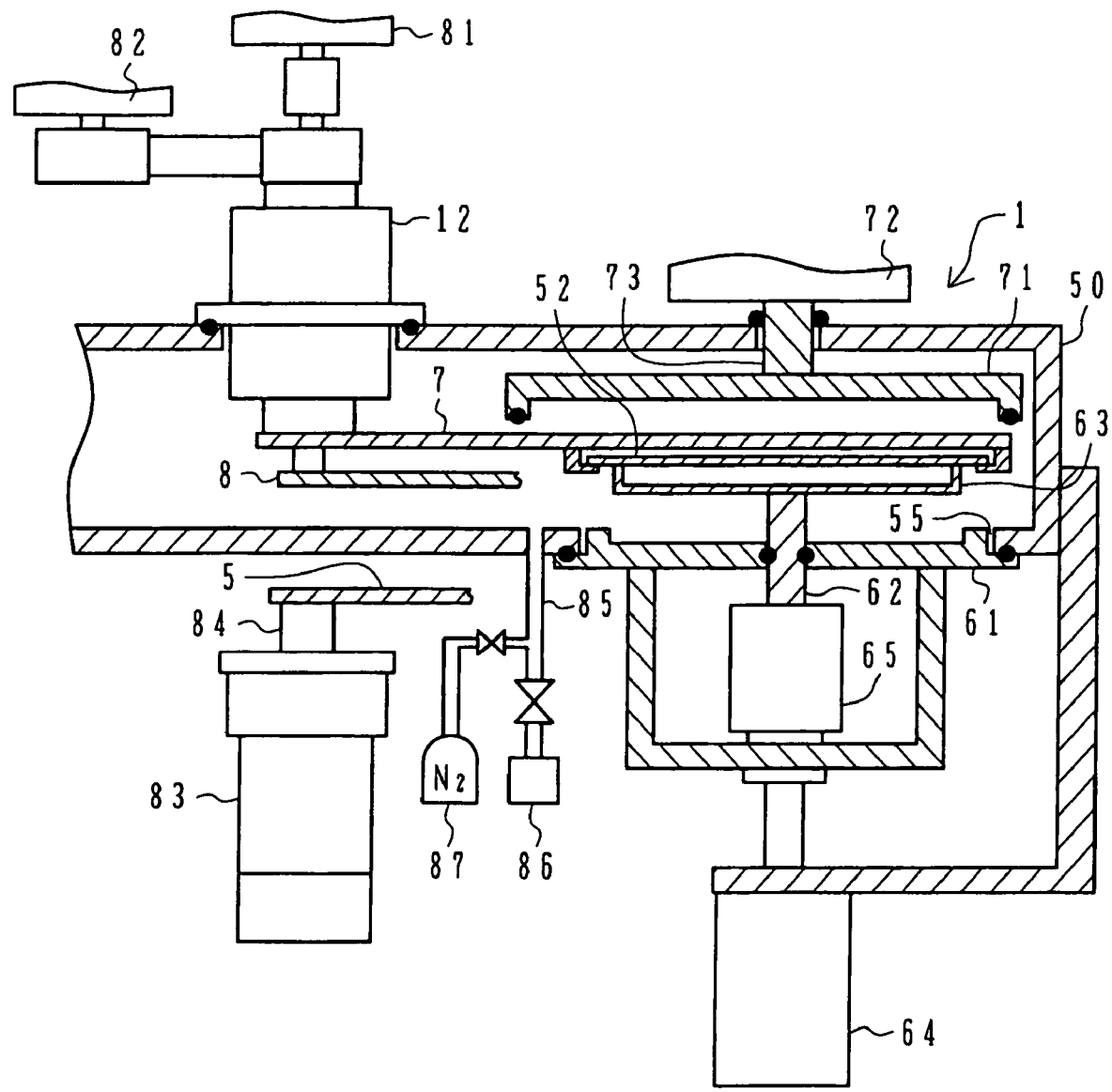
FIG. 2 is a cross sectional view of a load-lock mechanism of the ion implanter according to the embodiment.

FIG. 2 is a cross sectional view showing the vacuum chamber 50 and its internal structure, in an area where the first load-lock mechanism 1 and rotary shaft 12 are mounted. The structure of the second load-lock mechanism 2 is the same as that of the first load-lock mechanism 1.

An opening 55 larger than a wafer is formed through the bottom wall of the vacuum chamber 50. An air cylinder 64 raises or lowers an atmospheric side partition lid (gate valve) 61. As the atmospheric side partition lid 61 is raised to the highest position, the opening 55 is closed from the outside of the vacuum chamber 50. FIG. 2 shows the state that the atmospheric side partition lid 61 closes the opening 55. The contact area between the vacuum chamber 50 and atmospheric side partition lid 61 is maintained hermetic by an O-ring.

A support shaft 62 passes through the central area of the atmospheric side partition lid 61. The area along which the support shaft 62 passes through is maintained hermetic by an O-ring. A wafer lift table 63 is mounted on the top end of the support shaft 62 on the inner side of the vacuum chamber 50. An air cylinder lift 65 is mounted on the other end of the support shaft 62. By operating the air cylinder lift 65, the wafer lift table 63 can be raised or lowered. A wafer 52 to be processed is placed on the wafer lift table 63.

A support shaft 73 is disposed at a higher position along a line extending from the support shaft 62, and passes the upper wall of the vacuum chamber 50. The area along which the support shaft 73 passes through is maintained hermetic by an O-ring. A vacuum side partition lid 71 is mounted on the bottom end of the support shaft 73 on the inner side of the vacuum chamber 50. An air cylinder 72 for raising or lowering the vacuum side partition lid 71 is mounted on the other end of the support shaft 73.

As the vacuum side partition lid 71 is lowered and made in contact with the bottom surface of the vacuum chamber 50, the opening 55 is closed with the vacuum side partition lid 71. Although FIG. 2 shows the state that the distal end of the inner arm 7 is disposed under the vacuum side partition lid 71, the vacuum side partition lid 71 is lowered after the inner arm 7 swings to the position not disturbing the vacuum side partition lid 71 from being lowered. The wafer lift table 63 is also lowered to the potion not disturbing the vacuum side partition lid 71 from being lowered. An O-ring is disposed in the contact area between the vacuum side partition lid 71 and vacuum chamber 50 to maintain hermetic the contact area therebetween.

The double-shaft sealing unit (rotary shaft) 12 passes through the upper wall of the vacuum chamber 50. The inner arm 7 is mounted on the bottom end of one shaft of the rotary shaft 12 on the inner side of the vacuum chamber 50 and the other inner arm 8 is mounted on the lower end of the other shaft of the other rotary shaft 12. The one shaft of the double-shaft of the rotary shaft 12 is rotated by a motor 81 and the other shaft is rotated by a motor 82.

In the state that the vacuum side partition lid 71 is raised, the inner arms 7 and 8 can swing so that the distal ends of the arms can be inserted between the wafer lift table 63 and vacuum side partition lid 71. In this state, the inner arm 7 or 8 can pass or receive a wafer 52 to or from the wafer lift table 63.

As the atmospheric side partition lid 61 is raised to close the opening 55 from the lower side and the vacuum side partition lid 71 is lowered to close the opening 55 from the upper side, a hermetic space is formed between the atmospheric side partition lid 61 and vacuum side partition lid 71. This hermetic space is called a load-lock chamber hereinafter. A suction/exhaust pipe 85 mounted on the bottom wall of the vacuum chamber 50 communicates with the inside of the load-lock chamber. The air inside the load lock chamber is exhausted by a vacuum pump 86 connected to the suction/exhaust pipe 85 to make the inner space in a vacuum state. By opening a valve of a nitrogen gas bomb 87 connected to the suction/exhaust pipe 85, nitrogen gas is introduced into the load-lock chamber to make it in an atmospheric pressure state.

In this manner, the load-lock chamber can be made in the vacuum state or atmospheric pressure state, independently from the space in the vacuum chamber 50. The wafer 52 can be carried into or out of the load-lock chamber while the vacuum state in the vacuum chamber 50 is maintained.

A rotary shaft 84 is disposed under the vacuum chamber 50 to support the external arm 5 in a rotative state. The rotary shaft 84 is disposed on a line downward extending from the rotary shaft 12. A motor 83 rotates the rotary shaft 84.

In the state that the atmospheric side partition lid 61 and wafer lift table 63 are lowered, the external arm 5 swings so that the distal end of the external arm 5 can be disposed above the wafer lift table 63. In this state, a wafer can be passed from the external arm 5 to the wafer lift table 63.

Figure 3:
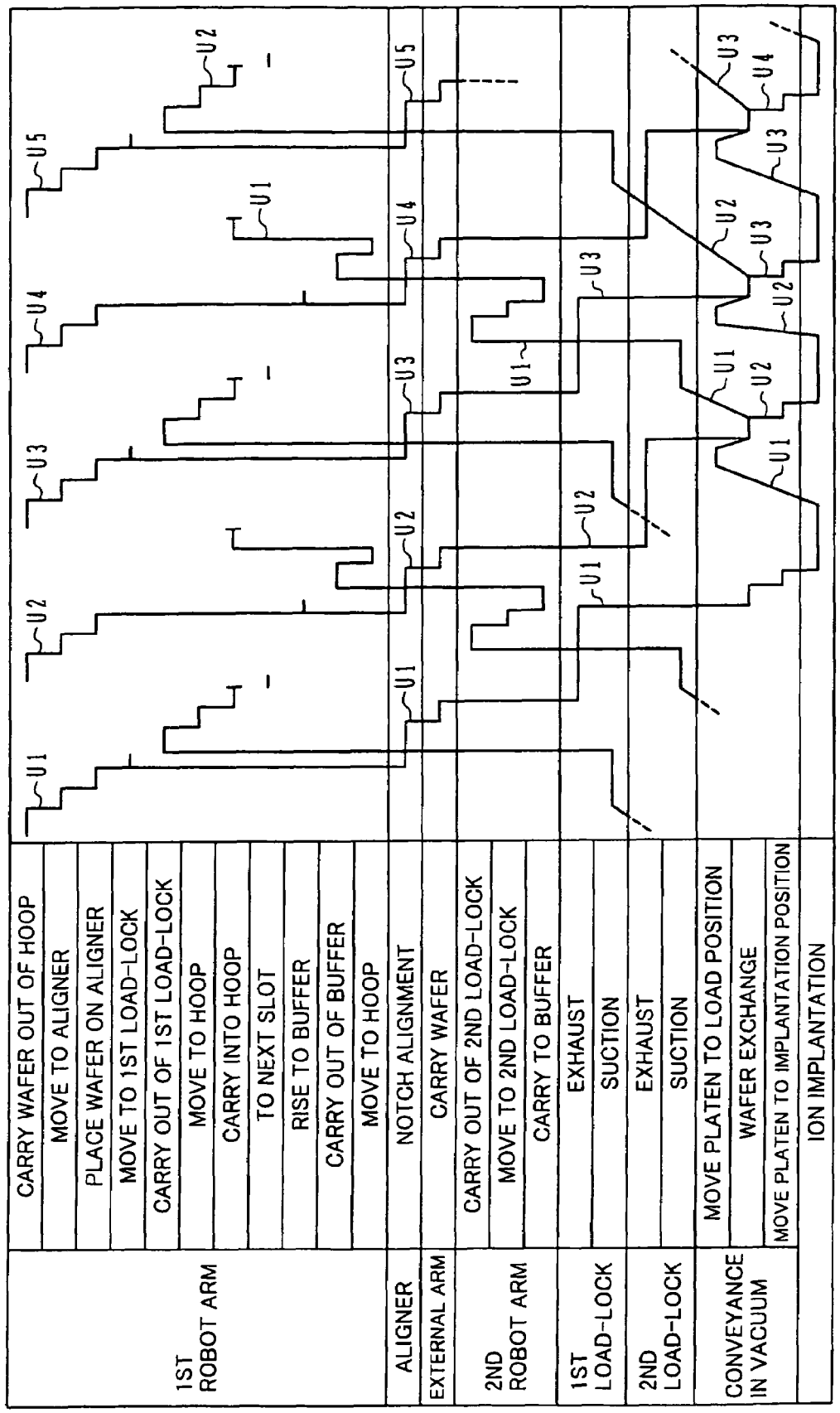
FIG. 3 is a diagram illustrating a procedure of carrying a wafer in the ion implanter according to the embodiment.

Next, with reference to FIGS. 1 to 3, description will be made on a wafer carrying process and an ion implantation process. Each of bent lines U1 to U5 shown in FIG. 3 illustrates the progress of carrying each wafer.

First, a carrying procedure of a wafer U1 will be described. The first robot arm 3 carries the wafer U1 from the hoop 51. Thereafter, the first robot arm 3 swings to the position of the aligner 6 and places the wafer U1 on the aligner 6. The aligner 6 detects the position of a notch of the wafer U1 to adjust the position of the wafer U1. After completion of this position alignment, the wafer U1 is passed from the aligner 6 to the external arm 5.

The external arm 5 swings to the position of the first load-lock mechanism 1 and places the wafer U1 on the wafer lift table 63 (refer to FIG. 2) of the first load-lock mechanism 1. The load-lock chamber of the first load-lock mechanism 1 is evacuated to make the inside thereof in a vacuum state. After the vacuum state is realized, the vacuum side partition lid 71 and wafer lift table 63 are raised.

The inner arm 7 carries the wafer U1 to the platen 10 standing by at the load position 10A. If a wafer subjected ion implantation is being held by the platen 10, the other internal arm 8 coveys the processed wafer from the platen 10 to the wafer lift table 63 of the first load-lock mechanism 1. Namely, wafers are exchanged between the first load-lock mechanism 1 and platen 10.

The platen 10 is moved to the ion implantation position to implant ions into the wafer U1. After the ion implantation, the platen 10 is moved to the load position 10A. Until this time, the wafer U2 to be processed next to the wafer U1 has been carried to the second load-lock mechanism 2 via a path to be described later. The wafer U1 held by the platen 10 is exchanged with the wafer U2 held by the second load-lock mechanism 2.

The wafer U1 is introduced into the load-lock chamber of the second load-lock mechanism 2. Nitrogen gas is introduced into the load-lock chamber and the wafer U1 is carried to the outside of the vacuum chamber 50. The second robot arm 4 receives the wafer U1 from the second load lock mechanism 2 and swings to the position of the buffer 11 to carry the wafer U1 to the buffer 11.

The first robot arm 3 receives the wafer U1 from the buffer 11 and swings to the position of the hoop 51 to carry the wafer U1 to the hoop 51. These processes described above complete the carrying process for the wafer U1.

In the above-described processes, the first robot arm 3 carries the wafer U1 to the aligner 6, and thereafter swings to the position of the first load-lock mechanism 1. The wafer already subjected to ion implantation is held by the first load-lock mechanism 1. The first robot arm 3 receives the processed wafer from the first load-lock mechanism 1 and swings to the position of the hoop 51 to carry the processed wafer to the hoop 51.

During the period while the first robot arm 3 carries the processed wafer from the first load-lock mechanism 1 to the hoop 51, the external arm 5 carries the wafer U1 still not processed to the first load-lock mechanism 1. If the external arm 5 is not provided, these two carrying procedures cannot be performed in parallel. By providing the external arm 5, the carrying performance can be improved.

Next, the carrying procedure for the second wafer U2 will be described. After the first robot arm 3 carries the processed wafer to the hoop 51, it moves to the next slot of the hoop 51 and carries the wafer U2 still not processed out of the hoop 51.

The carried wafer U2 is placed on the aligner 6 by the first robot arm 3 to adjust the position of the wafer U2. After the position alignment, the wafer U2 is carried to the second load-lock mechanism 2 by the external arm 5. The load-lock chamber of the second load-lock mechanism 2 is evacuated and the wafer U2 is carried into the vacuum chamber 50.

At this time, the wafer U1 subjected to the ion implantation and held by the platen 10 is located at the load position 10A. The processed wafer U1 held by the platen 10 is exchanged with the wafer U2 held by the second load-lock mechanism 2. The wafer U2 is carried to the ion implantation position to implant ions therein.

The processed wafer U2 is carried to the load position 10A. Until this time, the wafer U3 to be processed next to the wafer U2 has been carried to the first load-lock mechanism 1. The wafer U2 disposed at the load position 10A is exchanged with the wafer U3 held by the first load-lock mechanism 1. Thereafter, the wafer U2 is carried to the outside of the vacuum chamber 50 via the first load-lock mechanism 1, and carried to the hoop 51 by the first robot arm 3.

During the period while the wafer U2 is passed from the hoop 51 to the external arm 5 via the first robot arm 3 and aligner 6, the second robot arm 4 carries the processed wafer from the second load-lock mechanism 2 to the buffer 11.

During the period while the external arm 5 carries the wafer U2 to the second load-lock mechanism 2, the first robot arm 3 carries the processed wafer out of the buffer 11, and swings to the hoop 51 to carry it to the hoop 51. As described above, carriage by the first robot arm 3 and carriage by the external arm 5 are performed in parallel, so that the wafer carrying performance can be improved.

The wafer U3 to be processed next to the wafer U2 moves along a carrying path similar to that of the wafer U1. The wafer U4 to be processed next to the wafer U3 moves along a carrying path similar to that of the wafer U2. Wafers to be processed at the order of odd numbers move along the same carrying path, and wafers to be processed at the order of even numbers also move along the same carrying path.

As described above, since the external arm 5 is provided in addition to the first robot arm 3 and second robot arm 4, the wafer carrying performance can be improved.

In the above-described embodiment, although an ion implanter has been described by way of example, the embodiment is not limited only to the ion implanter, but the structure of the embodiment system can also be applied to other vacuum processing systems.

The present invention has been described in connection with the preferred embodiments. The invention is not limited only to the above embodiments. It will be apparent to those skilled in the art that other various modifications, improvements, combinations, and the like can be made.

I claim:

1. A vacuum processing system comprising:
   a vacuum chamber for defining an inner space capable of being evacuated, the vacuum chamber having an opening on a bottom wall thereof;
   a first load-lock mechanism comprising a lift table, an atmospheric side partition lid, and a vacuum side partition lid, wherein the lift table is capable of holding thereon and being raised or lowered through the opening to transfer a process object into and out of the vacuum chamber in a state that the vacuum chamber is maintained vacuum, the opening is closed from an outside of the vacuum chamber by the atmospheric side partition lid when the lift table is disposed in the vacuum chamber, and the opening is closed from an inner side of the vacuum chamber by the vacuum side partition lid when the lift table is out of the vacuum chamber;
   a holding mechanism disposed in the vacuum chamber, the holding mechanism being capable of holding a process object and moving the process object from a process position where the process object is processed to a load position and from the load position to the process position;
   an internal arm capable of exchanging a process object at the load position with another process object held by the first load-lock mechanism, while the holding mechanism is capable of holding a process object at the load position; and
   a controller for controlling the internal arm to exchange a process object held on the lift table of the first load-lock mechanism with another process object held by the holding mechanism at the load position,
   wherein the internal arm includes a first arm and a second arm both capable of swinging independently, the first and second arms are supported at different positions in a swing axial direction, the first arm is capable of swinging in a first swing direction and is capable of moving a process object at the load position to the lift table of the first load-lock mechanism, and at the same time the second arm is capable of swinging in a second swing direction reverse to the first swing direction and is capable of moving another process object held on the lift table of the first load-lock mechanism to the load position.

2. The vacuum processing system according to claim 1, further comprising a second load-lock mechanism comprising another lift table capable of holding thereon and transferring a process object into and out of the vacuum chamber in a state that the vacuum of the vacuum chamber is maintained, wherein the lift table of the first load-lock mechanism and the lift table of the second load-lock mechanism are placed at different positions on a plane perpendicular to the swing axial direction, a swing shaft of the internal arm is disposed at an equi-distance from the lift table of the first load-lock mechanism and the lift table of the second load-lock mechanism.

3. The vacuum processing system according to claim 2, further comprising:
an external arm disposed outside of the vacuum chamber and being capable of holding a process object and capable of carrying a held process object into the first load-lock mechanism and capable of carrying a held process object into the second load-lock mechanism;
a first robot arm disposed outside of the vacuum chamber and being capable of transferring the process object between a stock site outside of the vacuum chamber and the first load-lock mechanism and between the stock site and the external arm; and
a second robot arm disposed outside of the vacuum chamber and being capable of transferring the process object between the stock site and the second load-lock mechanism and between the stock site and the external arm.

4. The vacuum processing system according to claim 3, further comprising:
a buffer disposed outside of the vacuum chamber for temporarily holding the process object,
wherein the first robot arm and the second robot arm are capable of carrying the process object to the buffer and are capable of carrying the process object from the buffer.

5. The vacuum processing system according to claim 3, wherein the controller controls the first robot arm and the external arm in such a manner that the first robot arm carries a first process object from the stock site to the external arm, thereafter carries a second process object held by the first load-lock mechanism to the stock site, and during a period while the first robot arm carries the second process object, the external arm carries the first process object into the first load-lock mechanism.

6. The vacuum processing system according to claim 5, wherein the controller controls the first robot arm, the second robot arm and the external arm in such a manner that the second robot arm carries a third process object from the second load-lock mechanism to the buffer, in parallel to this operation the first robot arm carries a fourth process object from the stock site to the external arm, thereafter the first robot arm carries the third process object from the buffer to the stock site, and in parallel to this operation the external arm carries the fourth process object into the second load-lock mechanism.

7. The vacuum processing system according to claim 3, further comprising:
an aligner disposed outside of the vacuum chamber for receiving a process object from the first robot arm, adjusting a posture of the process object, and passing the process object whose posture was adjusted to the external arm,
wherein the external arm receives the process object from the first robot arm via the aligner.

* * * * *